(12) United States Patent
Tsuchiya et al.

(10) Patent No.: US 7,247,983 B2
(45) Date of Patent: Jul. 24, 2007

(54) MANUFACTURING METHOD OF LIGHT EMITTING ELEMENT

(75) Inventors: Kaoru Tsuchiya, Atsugi (JP); Hisao Ikeda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 177 days.

(21) Appl. No.: 10/894,346

(22) Filed: Jul. 20, 2004

(65) Prior Publication Data
US 2005/0212411 A1 Sep. 29, 2005

(30) Foreign Application Priority Data
Jul. 24, 2003 (JP) ............... 2003-279355

(51) Int. Cl.
*H01J 63/04* (2006.01)
(52) U.S. Cl. ............... 313/504; 313/498; 313/502; 313/506
(58) Field of Classification Search .......... 313/504, 313/498–503, 506–512, 169.1, 169.3; 428/690–691, 428/28–29, 82; 427/66, 532–535, 539
See application file for complete search history.

(56) References Cited

U.S. PATENT DOCUMENTS

| | | | |
|---|---|---|---|
| 5,688,551 A | 11/1997 | Littman et al. | |
| 5,989,737 A | 11/1999 | Xie et al. | |
| 6,132,280 A | 10/2000 | Tanabe et al. | |
| 6,166,488 A | 12/2000 | Arai | |
| 6,293,843 B1 | 9/2001 | Toya et al. | |
| 6,420,031 B1 * | 7/2002 | Parthasarathy et al. | 428/411.1 |
| 6,486,601 B1 | 11/2002 | Sakai et al. | |

(Continued)

FOREIGN PATENT DOCUMENTS

EP   0773707 A2   5/1997

(Continued)

OTHER PUBLICATIONS

C.W. Tang, et al. "Organic Electroluminescent Diodes" Applied Physics Letters, vol. 51, No. 12, pp. 913-915, 1987.

(Continued)

*Primary Examiner*—Joseph Williams
*Assistant Examiner*—Hana Asmat Sanei
(74) *Attorney, Agent, or Firm*—Nixon Peabody LLP; Jeffrey L. Costellia

(57) ABSTRACT

It is an object of the present invention to provide a method for manufacturing a light-emitting element in which decrease over time in emission efficiency of the light-emitting element having a structure in which an organic compound is sandwiched between a pair of electrodes is suppressed and long-life thereof can be enhanced. It is a method for manufacturing a light-emitting element having a plurality of layers composed of an organic compound between a pair of electrodes, wherein a processing to expose to an atmosphere including oxygen is performed after or before forming at least one layer of the plurality of layers. Note that the plurality of layers includes a light-emitting layer, and is composed of the light-emitting layer and at least one or more layers selected from a hole injecting layer, a hole transporting layer, a hole blocking layer, an electron transporting layer, and an electron injecting layer.

25 Claims, 7 Drawing Sheets

U.S. PATENT DOCUMENTS

| | | | |
|---|---|---|---|
| 6,611,098 B2 | 8/2003 | Mori et al. | |
| 6,664,732 B2 | 12/2003 | Yamazaki et al. | |
| 6,803,126 B2 | 10/2004 | Sotoyama et al. | |
| 6,956,323 B2 | 10/2005 | Kawaguchi et al. | |
| 2001/0043043 A1 | 11/2001 | Aoyama et al. | |
| 2002/0075422 A1 | 6/2002 | Kimura et al. | |
| 2002/0086181 A1* | 7/2002 | Lee-Mi et al. | 428/690 |
| 2002/0187567 A1 | 12/2002 | Yamazaki et al. | |
| 2003/0013280 A1* | 1/2003 | Yamanaka | 438/487 |
| 2003/0030370 A1* | 2/2003 | Tada | 313/504 |
| 2003/0117069 A1 | 6/2003 | Kato et al. | |
| 2003/0122140 A1* | 7/2003 | Yamazaki et al. | 257/88 |
| 2003/0129447 A1 | 7/2003 | Madathil et al. | |
| 2003/0157365 A1 | 8/2003 | Kinoshita et al. | |
| 2004/0229080 A1* | 11/2004 | Ikeda | 428/690 |

FOREIGN PATENT DOCUMENTS

| | | | |
|---|---|---|---|
| EP | 1 296 386 A2 | 3/2003 | |
| JP | 07-45367 | 2/1995 | |
| JP | 09-167684 | 6/1997 | |
| JP | 10-255985 A | 9/1998 | |
| JP | 2000/012237 A | 1/2000 | |
| JP | 2000012237 A | * | 1/2000 |
| JP | 2000-68068 | 3/2000 | |
| JP | 2000-164355 | 6/2000 | |
| JP | 2000-252077 | 9/2000 | |
| JP | 2001-52871 | 2/2001 | |
| JP | 2001/284059 A | 10/2001 | |
| JP | 2003/109770 A | 4/2003 | |
| JP | 2003-234194 | 8/2003 | |

OTHER PUBLICATIONS

S. A. Van Slyke, et al. "Organic Electroluminescent Devices with Improved Stability" Applied Physics Letters, vol. 69, No. 15, pp. 2160-2162, 1996.

Internation Search Report, (Application No. PCT/JP03/16373) date Mar. 2, 2004.

Partial Translation of Opinion of PCT International Searching Authority dated Sep. 7, 2004 for PCT/JP2004/010187.

Partial Translation of International Search Report dated Sep. 7, 2004 for PCT/JP2004/010187.

Nakanishi et al., "Doping Effect and Conduction Mechanism of Organic Semiconductor Evaporated Films", Technical Report of IEICE, *OME2000-108*, (Sep. 2000), pp. 55-59.

* cited by examiner

MANUFACTURING METHOD OF LIGHT EMITTING ELEMENT

FIELD OF THE INVENTION

The present invention relates to a method for manufacturing a light-emitting element. More specifically, the invention relates to a light-emitting element having a structure in which an organic compound is sandwiched between a pair of electrodes.

BACKGROUND ART

A light-emitting device utilizing an emission from an electroluminescent element (EL: Electro Luminescence) has attracted attention as a display device or a lighting device, and the development has been advanced.

In development of a light-emitting device, it is an object of the present invention to control decrease over time in emission brightness of a light-emitting element and to extend the lifetime thereof.

Therefore, the development of a light emitting material whose lifetime can be longer and the development of a sealing technique by which the degradation of the light-emitting material can be decreased have been carried out. In addition, as described in patent document 1, for example, it has been tried to extend a lifetime of a light-emitting layer formed of an inorganic compound by heat treatment at from 400° C. to 500° C. after an oxidation.

However, oxidation as shown in the patent document 1 needs heat treatment of 250° C. to 450° C. It is thought that such a heat treatment is improper for a light-emitting element having an organic material for a light emitting layer which has lower decomposition temperature and inferior heat resistance in comparison with the inorganic compound.

Thus, a new means for obtaining long lifetime of the light-emitting element using an organic compound as a light-emitting layer is required to be developed.

[Patent Document 1]
Japanese Patent Laid-Open No. 7-45367

DISCLOSURE OF THE INVENTION

[Problem to be Solved by the Invention]

According to the present invention, it is an object of the present invention to provide a manufacturing method of a long lifetime light-emitting element by controlling decrease of the emission efficiency of the light-emitting element having a structure in which an organic compound is sandwiched between a pair of electrodes over time.

[Means to Solve the Problem]

The present invention is about a method for manufacturing a light-emitting element having a plurality of layers composed of organic compounds between a pair of electrodes. And a feature of the invention is that, after or before forming at least one layer in the plurality of layers, processing of exposing to an atmosphere including electron-accepting gas is carried out.

The plurality of layers includes a light-emitting layer, and is composed of the light-emitting layer and one or more layers selected from a hole injecting layer, a hole transporting layer, a hole blocking layer, an electron transporting layer, and an electron injecting layer.

The following structure is cited as the example: a hole injecting layer\a hole transporting layer\a light-emitting layer\a hole blocking layer\an electron transporting layer\an electron injecting layer, a hole injecting layer\a hole transporting layer\a light-emitting layer\a hole blocking layer\an electron transporting layer, a hole injecting layer\a hole transporting layer\a light-emitting layer\an electron transporting layer\an electron injecting layer, a hole injecting layer\a hole transporting layer\a light-emitting layer\an electron transporting layer, or the like. However, a structure other than the above may be employed.

The light-emitting layer, the hole injecting layer, the hole transporting layer, the hole blocking layer, the electron transporting layer, the electron injecting layer may be formed of the same material or may includes the same material. In addition, the material may include an inorganic material such as an organic metallic complex.

All of the plurality of layers are not required to be formed of organic compounds. For example, the electron transporting layer may be formed of oxide, nitride, or an inorganic compound such as fluoride of one or more elements selected from an alkali metal or alkaline earth metal In addition, the plurality of layers may be a compound of such as tin (Sn), zinc (Zn), vanadium (V), ruthenium (Ru), samarium (Sm), and indium (In).

For example, oxygen is cited as an electron-accepting gas. The processing to expose the manufacturing element to the atmosphere including the electron-accepting gas may be carried out at room temperature (from 20° C. to 25° C.) for a certain time.

The processing to expose the element to the atmosphere including the electron-accepting gas may be carried out before or after forming an arbitrary layer in the above-mentioned layers (a light-emitting layer, a hole injecting layer, a hole transporting layer, a hole blocking layer, an electron transporting layer, an electron injecting layer). For example, the processing may be performed before or after forming the light emitting layer. Further, the processing may be performed before or after forming the hole injecting layer, or may be performed in a plurality of formation steps such as before forming the hole injecting layer and before forming the light-emitting layer.

In addition, each of the light-emitting layer, the hole injecting layer, the hole transporting layer, the hole blocking layer, the electron transporting layer, and the electron injecting layer may have a laminated structure. Therefore, when each of the layers has the laminated structure, the processing to expose to the atmosphere including the electron-accepting gas may be performed before or after forming each of the laminated layers.

When the laminated layer has a structure of such as a hole injecting layer\a hole transporting layer\a light-emitting layer\a hole blocking layer\an electron transporting layer\an electron injecting layer, it may be laminated from the hole injecting layer in order, or from the electron injecting layer in order. Also, in the case that the laminated layer has other structures, the order is not specifically limited.

[Effect of the Invention]

By manufacturing a light-emitting element according to the present invention, decrease of the emission brightness over time is reduced in the case of keeping light emission after current with constant current density is applied to the light-emitting element, thereby providing a long lifetime light-emitting element. In addition, rise of drive voltage of the light-emitting element is suppressed in the case of keeping light emission after current is applied to a light-emitting element with a constant current density. As a result, low power consumption of the light-emitting element can be enhanced. Furthermore, in the light-emitting device using the light-emitting element according to the present invention, long lifetime and low power consumption can be enhanced.

DESCRIPTION OF SYMBOLS

10—substrate, 11—TFT, 12—TFT, 13—light-emitting element, 14—first electrode, 15—a layer containing light-emitting material, 16—second electrode, 17—wiring, 201—substrate, 201a—substrate, 201b—substrate, 201c—substrate, 202—first electrode, 203—hole injecting layer, 204—hole transporting layer, 205—light-emitting layer, 206—electron transporting layer, 207—second electrode, 401—source side driver circuit, 402—pixel portion, 403—gate side driver circuit, 404—sealing substrate, 405—sealing agent, 407—space, 408—wiring, 409—FPC (flexible printed circuit), 410—an element substrate, 411—switching TFT, 412—current control TFT, 413—first electrode, 414—insulating material, 416—layer containing light-emitting material, 417—second electrode, 418—light-emitting element, 423—n-channel type TFT, 424—p-channel type TFT, 5501—case, 5502—supporting medium, 5503—display portion, 5511—main body, 5512—display portion, 5513—voice input, 5514—operation switch, 5515—battery, 5516—image receiving portion, 5521—main body, 5522—case, 5523—display portion, 5524—key board, 5531—main body, 5532—stylus, 5533—display portion, 5534—operation button, 5535—external interface, 5551—a main body, 5552—display portion (A), 5553—an eyepiece, 5554—operation switch, 5555—display portion (B), 5556—battery, 5561—main body, 5562—voice output portion, 5564—display portion, 5565—operation switch, 5566—antenna.

BEST MODE FOR CARRYING OUT THE INVENTION

Figure 2:
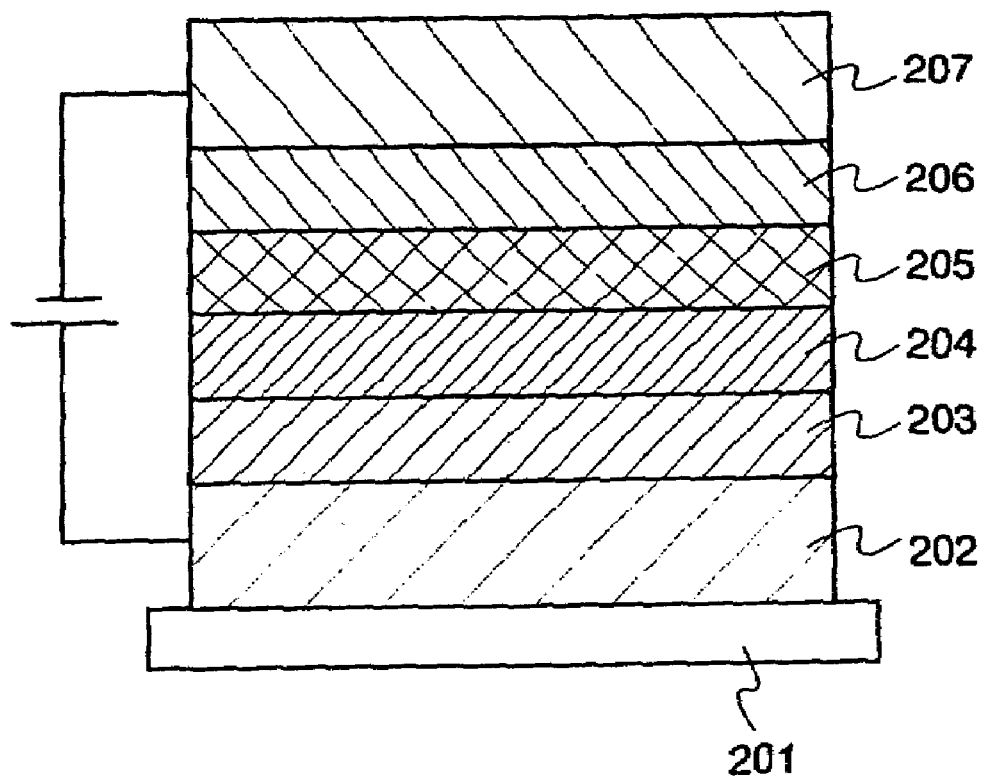
FIG. 2 is a view which describes a mode of a light-emitting element manufactured according to the present invention.

In this embodiment mode, a method for manufacturing a light-emitting element as shown in FIG. 2 in which a plurality of layers composed of an organic compound is provided between a pair of electrodes is described.

First, a first electrode (anode) 202 is formed over a substrate 201. Here, glass or plastic can be used as the substrate 201. Also, a material other than glass or plastic may be also used as far as it serves as a supporting medium for forming the light-emitting element. Further, metal, alloy, an electrically conductive compound, or mixture of these materials with large work function (work function of equal to or more than 4.0 eV) is preferably used as the material for forming the first electrode 202. Specifically, in addition to Indium Tin Oxide (ITO) and Indium Zinc Oxide (IZO) in which 2 to 20% Zinc Oxide (ZnO) is mixed into Indium Oxide, Aurum (Au), Platinum (Pt), Nickel (Ni), Tungsten (W), Chromium (Cr), Molybdenum (Mo), iron (Fe), Cobalt (Co), Copper (Cu), Palladium (Pd), nitride of a metal material (TiN), or the like can be used.

In vacuum, the substrate 201 over which the first electrode (an anode) 202 is formed is heat-treated.

Next, the substrate 201 to which the process up to forming the first electrode 202 is performed is left in a treatment chamber including an electron-accepting gas at room temperature (20° C. to 25° C.) for a certain time. As the electron-accepting gas, oxygen is noted for example.

Next, a hole injecting layer 203 is formed over the first electrode 202. For the material for forming the hole injecting layer 203, a compound of phthalocyanine system can be used. Phthalocyanine (abbrev. $H_2Pc$), copper phthalocyanine (abbrev. CuPc), or the like can be used for example. In addition, the polymeric materials in which polystyrene sulfonate (PSS) and polyethylene dioxythiophene (PEDOT) are mixed, or the like can be used. Note that the hole injecting layer 203 may be formed by laminating each of the above materials respectively.

Then, a hole transporting layer 204 is formed over the hole injecting layer 203. For the material for forming the hole transporting layer 204, a compound of aromatic amine system (i.e., having benzene-ring to nitrogen bonds) can be used. As the material which is widely used, in addition to 4,4'-bis [N-(3-methylphenyl)-N-phenyl-amino]-biphenyl (abbrev. TPD), 4,4'-bis [N-(1-naphthyl)-N-phenyl-amino]-biphenyl (abbrev. α-NPD) that is a derivative thereof, or starburst-type aromatic amine compounds such as 4,4',4"-tris (N, N-diphenyl-amino)-triphenylaminine (abbrev. TDATA), 4,4',4"-tris [N-(3-methylphenl)-N-phenyl-amino]-triphenylamine (abbrev. MTDATA) are noted for the example. Note that the hole transporting layer 204 may be laminated layer each of which is formed of the above mentioned material.

Next, a light-emitting layer 205 is formed over the hole transporting layer 204. For example, a light-emitting material having high emission efficiency and carrier transparency such as 9,10-di(2-naphthyl) anthracene (abbrev. DNA) can be used. In addition, one formed by co-evaporation of N,N'-dimethyl quinacridon (abbrev. DMQd) which is a light-emitting material as a guest material and a host material which can be formed desirably and has a higher carrier transport property (which is not easily crystallized), such as $Alq_3$, can be also used.

An electron transporting layer 206 is formed over the light-emitting layer 205. As the material for forming the electron transporting layer 206, metal complexes having quinoline skeletons or benzoquinoline skeletons such as tris (8-quinolinolato) aluminum (abbrev. $Alq_3$), tris (5-methyl-8-quinolinolato) aluminum (abbrev. $Almq_3$), and bis (10-hydroxybenzo[h]-quinolinato) beryllium (abbrev. $BeBq_2$), and bis (2-methyl-8-quinolinolato)-4-phenylphenolato-aluminum (abbrev. BAlq) are used. Furthermore, metal complexes having oxazole or thiazole ligands such as zinc bis[2-(2-hydroxyphenyl)-benzoxazorato] (abbrev. $Zn(BOX)_2$), and zinc bis[2-(2-hydroxyphenyl)-benzothiazorato] (abbrev. Zn(BTZ)$_2$) may be used. Furthermore, in addition to the metal complexes, materials such as 2-(4-biphenylyl)-5-(4-tert-buthylphenyl)-1,3,4-oxadiazole (abbrev. PBD) and 1,3-bis [5-(p-tert-butylphenyl)-1,3,4-oxadiazole-2-il]benzene (abbrev. OXD-7), 3-(4-tert-butylphenyl)-4-phenyl-5-(4-biphenylyl)-1,2,4-triazole (abbrev. TAZ), 3-(4-tert-butylphenyl)-4-(4-ethylphenyl)-5-(4-biphenylyl)-1,2,4-triazole (abbrev. p-EtTAZ), bathophenanthroline (abbrev. BPhen), and batho-cuproine (abbrev. BCP) can be used. Note that the electron transporting layer 206 may be laminated layers formed from the above-mentioned materials.

A second electrode (cathode) 207 is formed over the electron transporting layer 206. For the material for forming the second electrode 207, metal, alloy, an electric conductive compound with small work function (work function of equal to or less than 3.8 eV), mixture of these materials, or the like can be used. As the specific example of such a cathode material, an element belonging to group 1 or group 2 of an element periodic table, namely, alkali metal such as lithium (Li) or cesium (Cs), alkaline earth metal such as magnesium (Mg), calcium (Ca), strontium (Sr), or alloy including these material (Mg:Ag, Al:Li) is noted. However, between the second electrode 207 and the light-emitting layer, by providing a layer which has a function of promoting electron injection to laminate with the second electrode, various conductive materials such as Al, Ag, ITO can be used as the second electrode 207 regardless of large or small of the work function.

In addition, as the layer which has the function of promoting electron injection, a compound of alkali metal or alkaline earth metal such as lithium fluoride (LiF), cesium fluoride (CsF), and calcium fluoride (CaF$_2$) can be used. Besides, a material having an electron transport property in which the alkali metal or the alkaline earth metal is included, for example, Alq in which Mg is included can be used.

Any one of methods, vapor deposition, ink jetting and spin coating may be used for forming the hole injecting layer 203, the hole transporting layer 204, the light-emitting layer 205, and the electron transporting layer 206. Further, each of the layers may be formed of a material other than the above-described materials.

The structure of the light-emitting element is not limited to the above, and it may have a different laminated structure between the first electrode 202 and the second electrode 207 from the above. For example, a hole blocking layer may be provided between the light-emitting layer and the electron transporting layer. An electron injecting layer, an electron transporting layer, a hole blocking layer, a hole transporting layer, and a hole injecting layer are freely combined and provided in addition to the light-emitting layer. And, between the first electrode 202 and the second electrode 207, a light-emitting element having a laminated structure such as a hole injecting layer\a light-emitting layer\an electron transporting layer, a hole injecting layer\a hole transporting layer\a light-emitting layer\a hole blocking layer\an electron transporting layer\an electron injecting layer, a hole injecting layer\a hole transporting layer\a light-emitting layer\a hole blocking layer\an electron transporting layer, a hole injecting layer\a hole transporting layer\a light-emitting layer\an electron transporting layer\an electron injecting layer, or a hole injecting layer\a hole transporting layer\a light-emitting layer\an electron transporting layer may be applied.

In addition, as the material for the hole blocking layer, BAlq, OXD-7, TAZ, p-EtTAZ, BPhen, BCP, or the like can be used.

Further, the processing to expose to the atmosphere including oxygen may be performed in any steps as far as it is carried out after forming the first electrode 202 and before forming the second electrode. For example, it may be carried out before or after forming the hole injecting layer, the hole transporting layer, the light-emitting layer, the hole blocking layer, the electron transporting layer, or the electron injecting layer. Further, for example, in the case where each of the light-emitting layer, the hole injecting layer, the hole transporting layer, the hole blocking layer, the electron transporting layer, and the electron injecting layer has a laminated structure, the processing to expose to the atmosphere including oxygen may be performed before or after forming each of the laminated layer. For example, in the case where the hole injecting layer has a two-layer structure, after the first layer is formed and exposed to the atmosphere including oxygen, the second layer may be formed. Furthermore, the processing to expose to the atmosphere including oxygen may be carried out several times in different steps.

Figure 3:
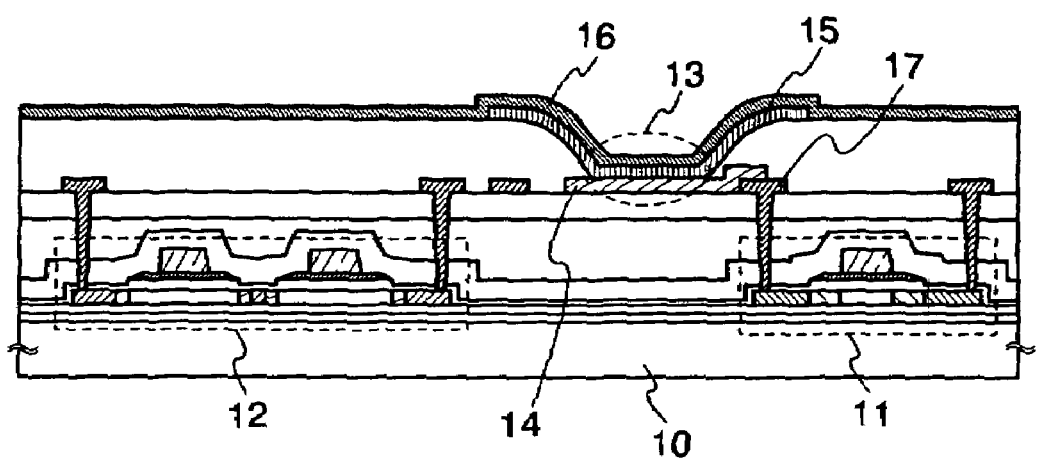
FIG. 3 is a view which describes a mode of a light emitting device using a light-emitting element manufactured according to the present invention.

In this embodiment mode, a light-emitting element is manufactured over a substrate 201 formed of glass, plastic, or the like. A passive type light-emitting device can be manufactured by manufacturing a plurality of such light-emitting elements over the same substrate. The light-emitting elements can be formed over a thin film transistor (TFT) array substrate, for example, as shown in FIG. 3 in addition to the substrate formed of glass, plastic, or the like. Accordingly, an active matrix type light-emitting device in which the drive of the light-emitting element is controlled by the TFT can be manufactured. In FIG. 3, TFTs 11 and 12 are provided over a substrate 10. And a light-emitting element 13 having a layer 15 including a light-emitting material between a first electrode 14 and a second electrode 16 are provided over the layer including the TFTs 11 and 12. Here, the first electrode 14 and the TFT 11 are connected through a wiring 17. Note that the structure of the TFT is not particularly limited.

As described, the processing to expose to the atmosphere in which an organic compound includes oxygen is carried out, and the light-emitting element is manufactured. Thus the light-emitting element in which decrease of the emission brightness over time is small can be manufactured when current is applied with constant current density to emit light constantly. Namely, long lifetime of the light-emitting element can be enhanced.

EXAMPLE 1

In this example, a method for manufacturing a light-emitting element shown in FIG. 2 is described. Also, in this example, a light-emitting device manufactured with processing to expose to an atmosphere including oxygen before forming a hole injecting layer is described.

First, ITO is formed over a substrate 201 by sputtering, thereby forming a first electrode 202.

Then heat treatment is performed to the substrate 201 over which the ITO is formed at 150° C. for 30 minutes in vacuum kept at $1 \times 10^{-5}$ Pa.

Next, a substrate 201 to which the process up to forming a first electrode 202 has been performed is exposed to an atmosphere including oxygen. Specifically, 25-sccm oxygen is applied to a treatment chamber in which vacuum degree is kept at $1 \times 10^{-5}$ Pa, and then the substrate 201 is exposed to the chamber in 1.0 Pa and at a room temperature (from 20° C. to 25° C.) for 5 minutes. There is no possibility that the organic compound is decomposed due to the heat since the processing is carried out at a room temperature.

Then, CuPc is formed over the first electrode 202 with a film thickness of 20 nm, thereby forming a hole injecting layer. And then α-NPD is formed over a hole injecting layer 203 with a film thickness of 40 nm, thereby forming a hole transporting layer 204.

DNA is formed over the hole transporting layer 204 with a film thickness of 30 nm, thereby forming a light-emitting layer 205.

After forming Alq$_3$ over the light-emitting layer 205 with a film thickness of 30 nm to form a electron transporting layer 206, calcium fluoride (CaF$_2$) and aluminum (Al) are formed with a film thickness of 1 nm and 200 nm respectively, thereby forming a second electrode 207 formed of two-layer films. The CaF$_2$ has a function to promote electron injection.

In the light-emitting element manufactured as described, the first electrode 202 functions as an anode and the second electrode 207 functions as a cathode, respectively. By applying voltage between the first electrode 202 and the second electrode 207 to apply current, the hole and the electron are recombined in the light-emitting layer 205 and emit light.

Figure 1:
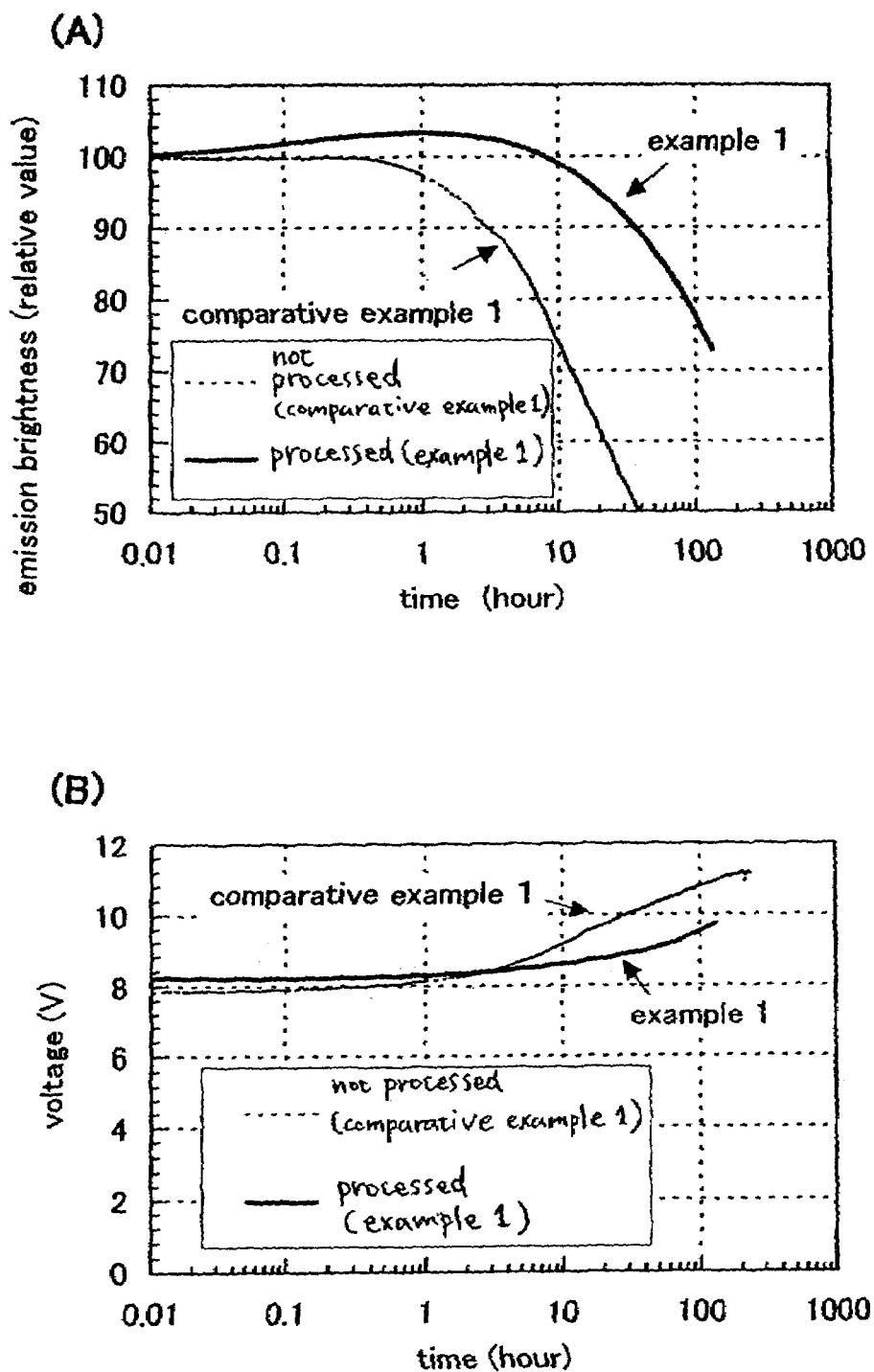
FIG. 1 is a result of measurement that shows change of emission brightness of a light-emitting element manufactured according to the present invention over time.

FIG. 1A shows a measurement result of change in emission brightness of a light-emitting element manufactured according to this example over time. In FIG. 1A, a horizontal axis shows elapsed time (hour) and a vertical axis shows emission brightness. The emission brightness is shown in a relative value to early stage brightness when the early stage brightness is set to 100. As a comparative example, a measurement result of change over time in emission brightness of a light-emitting element manufactured without the processing to expose to the atmosphere including oxygen after forming the first electrode 202 is also shown in FIG. 1.

The measurement of the change over time in emission brightness is performed every determined time while current with constant current density is applied continuously. Note that the value when the early stage brightness becomes 200 cd is used for the current density.

FIG. 1A indicates that the decrease over time in emission brightness is smaller and a more preferable characteristic is given when the processing to expose to the atmosphere including oxygen is carried out after forming the first electrode 202.

Further, FIG. 1B shows the change over time in voltage applied so as to apply current with constant current density to the light-emitting element. In FIG. 1B, a horizontal axis shows elapsed time (hour) and a vertical axis shows emission brightness. As a comparative example, a measurement result of change over time in voltage applied to a light emitting element which is manufactured without the step of exposing to an atmosphere including oxygen and is manufactured with other steps according to the description of this embodiment is also shown in FIG. 1B.

In FIG. 1B, as seen, the rise of voltage value over time for applying to the light emitting element is smaller when the processing to expose to the atmosphere including oxygen is carried out after forming the first electrode 202. Namely, it turns out that the rise of the drive voltage of the light-emitting element is suppressed in the light-emitting element to which the processing to expose to the atmosphere including oxygen is performed after forming the first electrode 202.

As described above, by manufacturing a light-emitting element according to the present invention, when current is applied with constant current density to keep the emission, decrease over time in emission brightness can be smaller and long lifetime of the light-emitting element can be enhanced. Further, when current is applied to the light-emitting element with constant current density, the rise of the drive voltage of the light-emitting element can be suppressed and lower power consumption thereof can be enhanced.

EXAMPLE 2

In this example, a light-emitting element shown in FIG. 2 as illustrated in Example 1, which is different in a material for forming a hole injecting layer from the one used in Example 1 is described. In addition, as is the case with Example 1, the light-emitting element is manufactured with processing of exposing to an atmosphere including oxygen before forming the hole injecting layer in this example.

In this example, a mixture of PEDOT and PSS formed by spin coating is used as a hole injecting layer 203. In addition, as for a first electrode 202; a hole transporting layer 204; a light-emitting layer 205; an electron transporting layer 206; and a second electrode 207, each of the materials, the film thickness, and the formation method is the same as those in Example 1.

First, ITO is formed over a substrate 201 by sputtering, thereby forming a first electrode 202.

Next, the substrate 201 over which the ITO is formed is heat treated at 150° C. for 30 minutes in vacuum kept at $1 \times 10^{-5}$ Pa.

Then, the substrate 201 to which the process up to forming the first electrode has been performed is exposed to an atmosphere including oxygen. Specifically, 25 sccm oxygen is applied to a treatment chamber kept the vacuum degree at $1 \times 10^{-5}$ Pa, and the substrate is exposed to the treatment chamber in 1.0 Pa and at room temperature (20° C. to 25° C.) for 5 minutes.

Next, a mixture material of PEDOT and PSS is formed over the first electrode 202, thus the hole injecting layer 203 is formed. And α-NPD is formed with a film thickness of 40 nm over the hole injecting layer 203, thereby forming the hole transporting layer 204. In this example, two kinds of light-emitting elements formed of the mixture material of PEDOT and PSS having different film thicknesses are manufactured. The film thicknesses are 30 nm (Example 2–1) and 90 nm (Example 2—2), respectively.

Next, DNA is formed over the hole transporting layer 204 with a film thickness of 30 nm, thereby forming the light-emitting layer 205.

Alq$_3$ is formed over the light-emitting layer 205 with a film thickness of 30 nm, thus the electron transporting layer 206 is formed. Then each of calcium fluoride CaF$_2$ and aluminum Al is formed with a film thickness of 1 nm and 200 nm, respectively over the electron transporting layer 206, thereby forming the second electrode 207 formed of two-layer films. Note that CaF$_2$ has a function to promote electron injection.

In the light-emitting element manufactured according to the above, the first electrode 202 functions as an anode and the second electrode 207 functions as a cathode, respectively. Current is applied by applying voltage between the first electrode 202 and the second electrode 207; holes and electrons are recombined in the light-emitting layer 205, thereby emitting light.

Figure 4:
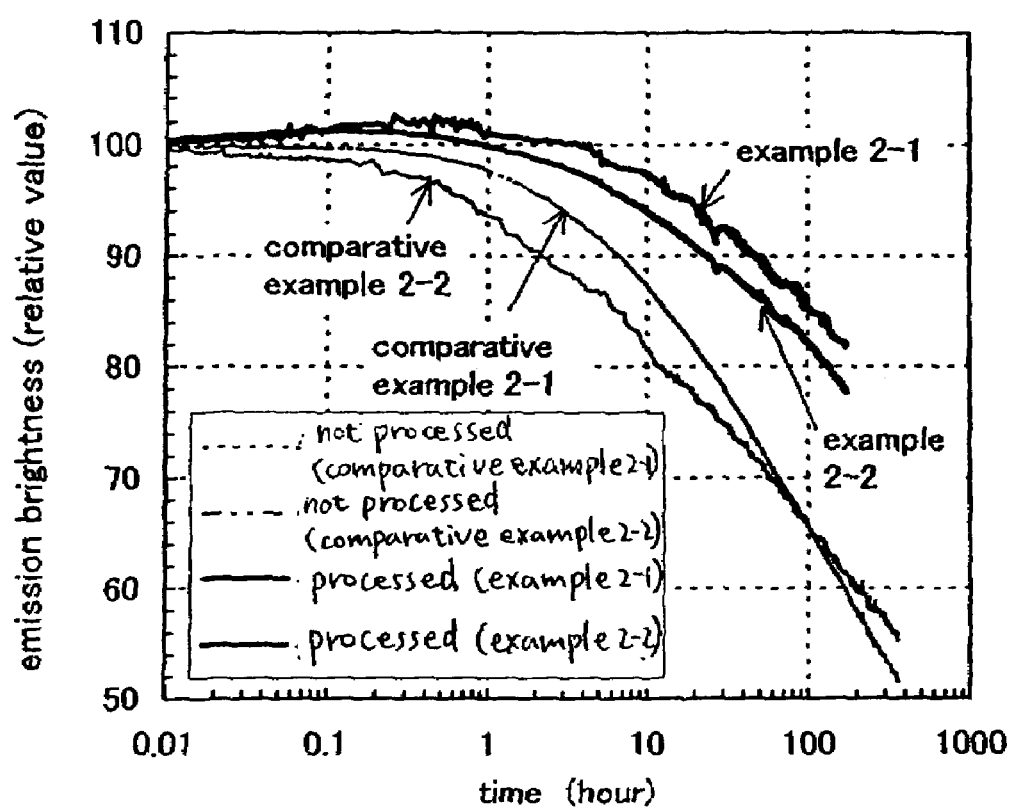
FIG. 4 is a result of measurement that shows change of emission brightness of a light-emitting element manufactured according to the present invention over time.

In FIG. 4, a measurement result of change over time in emission brightness of the light-emitting element manufactured according to the example is shown. In FIG. 4, a horizontal axis shows elapsed time (hour) and a vertical axis shows emission brightness. The emission brightness is shown in a relative value to initial brightness when the initial brightness is regarded as 100. As a comparative example, a measurement result of change over time in emission brightness of a light-emitting element manufactured without the processing to expose to an atmosphere including oxygen after forming the first electrode 202 is also shown in FIG. 4. Note that the comparative example in correspondence with Example 2–1 is that of 2–1, and the comparative example in correspondence with Example 2—2 is that of 2—2.

FIG. 4 indicates that the decrease over time in emission brightness is smaller and a more preferable characteristic is given when the processing to expose to the atmosphere including oxygen is carried out after forming the first electrode 202.

EXAMPLE 3

In this example, a light-emitting element shown in FIG. 2 as illustrated in Example 1, which is different from Example 1 in the material used for the light-emitting layer is described.

In this example, a layer formed by co-evaporating DMQd as a guest material with $Alq_3$ is used as a light-emitting layer 205. In addition, while a layer formed by evaporating $Alq_3$ is used as an electron transporting layer 206 as is the case with Example 1, the film thickness thereof is set to 37.5 nm in this Example. As for the first electrode 202, a hole injection layer 203, a hole transporting layer 204, and a second electrode 207, each of the materials, the film thickness, and the formation methods is the same as those in Example 1.

Further, in this example, three light-emitting elements each of which is the same in the material, the film thickness, and the formation method, but different in the operation part to be exposed to the atmosphere including oxygen are manufactured. The three light-emitting elements are to be formed over a first substrate 201a, a second substrate 201b, and a third substrate 201c, respectively. The same material is used for each of the first to the third substrates. Each of the following steps is to be performed to every substrate unless there is specific clear notification.

First, ITO is formed over the first to the third substrates 201 (201a, 201b, 201c) by sputtering, and the first electrode 202 is formed over each of the substrates.

Then the substrates 201 (201a, 201b, 201c) over which the ITO has been deposited is heat treated at 150° C. for 30 minutes in vacuum kept at $1\times10^{-5}$ Pa.

Next, the first substrate 201a to which the process up to forming the first electrode 202 has been performed is exposed to the atmosphere including oxygen (Example 3–1). Specifically, 25 sccm oxygen is flowed in a treatment chamber with keeping the vacuum degree at $1\times10^{-5}$ Pa, and the substrate is exposed in the treatment chamber at 1.0 Pa and room temperature (20° C. to 25° C.) for 5 minutes.

Next, CuPc is deposited with a film thickness of 20 nm over the first electrode 202, thus the hole injecting layer 203 is formed.

Next, the second substrate 201b to which the process up to forming the hole injecting layer 203 has been performed is exposed to an atmosphere including oxygen (Example 3–2). Specifically, 25 sccm oxygen is flowed in the treatment chamber kept at $1\times10^{-5}$ Pa vacuum degree, and the substrate is exposed in the treatment chamber with 1.0 Pa vacuum degree at room temperature (20° C. to 25° C.) for 5 minutes.

Next, α-NPD is deposited over the hole injecting layer 203 with a film thickness of 40 nm, thus the hole transporting layer 204 is formed.

Next, DMQd and $Alq_3$ are co-evaporated over the hole transporting layer 204 with a film thickness of 37.5 nm, thus the light-emitting layer 205 is formed. Note that the DMQd is used as a guest material which emits green color.

Next, $Alq_3$ is formed over the light-emitting layer 205 with a film thickness of 37.5 nm, thus the electron transporting layer 206 is formed.

Next, the third substrate 201c to which the process up to forming the electron transporting layer 206 has been performed is exposed to the atmosphere including oxygen (Example 3–2). Specifically, 25 sccm oxygen is flowed in the treatment chamber kept in $1\times10^{-5}$ Pa vacuum degree, and the substrate is exposed in the treatment chamber kept at 1.0 Pa vacuum degree and at room temperature (20° C. to 25° C.).

Calcium fluoride $CaF_2$ and aluminum Al are formed over the electron-transporting layer 206 with a film thickness of 1 nm and 200 nm, respectively, thereby forming the second electrode 207 formed from two-layered film. Note that $CaF_2$ has a function of promoting electron injection.

In a light-emitting element manufactured as described above, the first electrode 202 functions as an anode and the second electrode 207 functions as a cathode, respectively. By applying voltage between the first electrode 202 and the second electrode 207 to apply current, holes and electrons are re-combined in the light-emitting layer 205, thereby emitting light.

Figure 5:
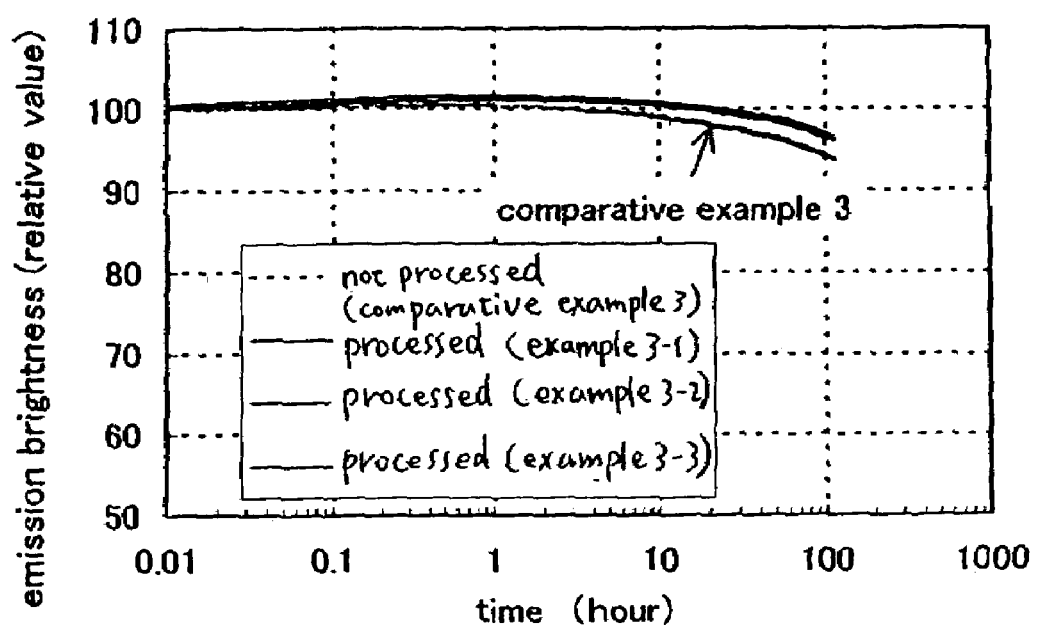
FIG. 5 is a result of measurement that shows change of emission brightness of a light-emitting element manufactured according to the present invention over time.

In FIG. 5, a measurement result of change over time in emission brightness of a light-emitting element manufactured according to this example is shown. In FIG. 5, a horizontal axis shows elapsed time (hour) and a vertical axis shows emission brightness. The emission brightness is shown in a relative value to an initial brightness when the initial brightness is regarded as 100. As a comparative example, a measurement result of change over time in emission brightness of a light-emitting element manufactured without the processing of exposing to the atmosphere including oxygen after forming the first electrode 202 is also shown in FIG. 5 (comparative example 3). The method for the measurement is as described in Example 1.

FIG. 5 indicates that the decrease over time in emission brightness is smaller and a more preferable characteristic is given when the processing of exposing to the atmosphere including oxygen is carried out after forming the first electrode 202.

EXAMPLE 4

Figure 6:
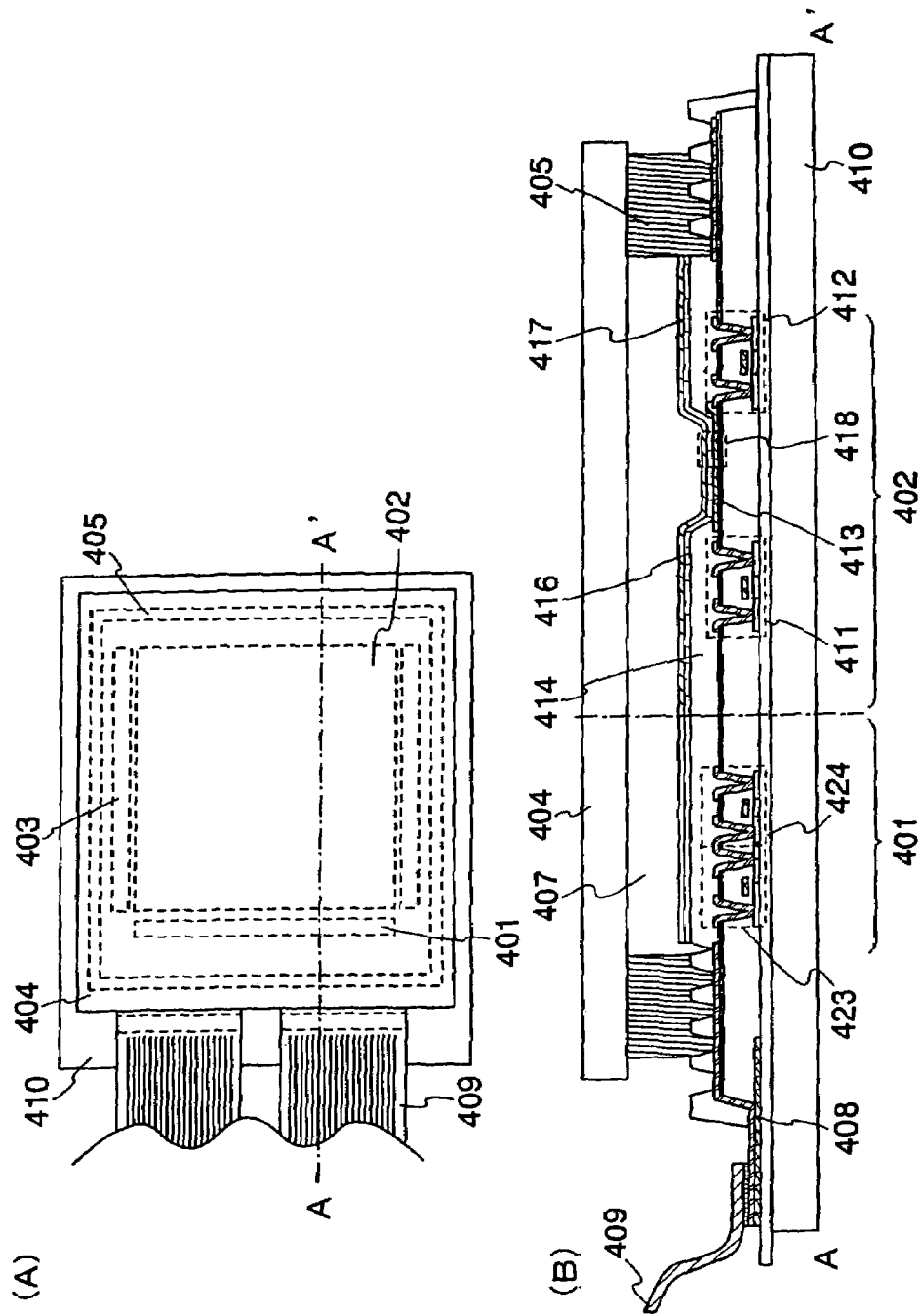
FIG. 6 is a view which describes a mode of a light-emitting device using a light-emitting element manufactured according to the present invention.

In this example, a light-emitting device having a light-emitting element of the present invention into a pixel portion thereof is described with reference to FIG. 6. FIG. 6A is a top view of the light-emitting device and FIG. 6B is a cross-sectional view taken along the line A–A' of FIG. 6A. Reference numeral 401 indicated by a dotted line is a driver circuit portion (a source side driver circuit), 402 is a pixel portion, and 403 is a driver circuit portion (a gate side driver circuit). Further, reference numeral 404 is a sealing substrate, 405 is an adhesive agent, and the inside surrounded by the adhesive agent 405 is a space 407.

Reference numeral 408 is a wiring for transmitting signals to be inputted to the source side driver circuit 401 and the gate side driver circuit 403. The wiring 408 receives a video signal, a clock signal, a start signal, a reset signal, or the like from a FPC (a flexible printed circuit) 409 that serves as an external input terminal. Though only the FPC is illustrated here, a PWB (a print wiring board) may be attached to the FPC. The light-emitting device in this example includes not only a body of light-emitting device but also a light-emitting device in the state of being attached with the FPC or the PWB.

Next, a cross-sectional structure of the light emitting is described. The drive circuit portion and the pixel portion are formed over the substrate 410, here the source side driver circuit 401 that serves as a drive circuit portion and the pixel portion 402 are shown.

In the source side driver circuit 401, a CMOS circuit that is formed by combining an n-channel TFT 423 with a p-channel TFT 424 is formed. A TFT for forming a driver circuit may be formed of a known CMOS circuit, PMOS circuit, or NMOS circuit. The driver circuit formed on a substrate, which is referred to as a driver-integrated type is described in this example mode, but not exclusively, the driver circuit may be formed outside.

In addition, the pixel portion 402 is formed of plural pixels including a switching TFT 411, a current control TFT 412, and a first electrode 413 connected to the current control TFT 412 and the drain thereof. An insulating film 414 is formed to cover an edge portion of the first electrode 413. Here, the insulating film 414 is formed by using a positive type photosensitive acrylic resin.

To improve coverage, a curved surface having a curvature is to be formed in the upper end portion or the bottom end portion of the insulating material 414. For example, in the case that a positive type photosensitive acrylic is used as a material for the insulating material 414, it is preferable that only the upper end portion of the insulating material is formed to have the curved surface having curvature radius (0.2 μm to 3 μm). Either of a negative type that is a soluble material in etchant according to photosensitive light or a positive type that is dissoluble in etchant according to light can be used as the insulating material 414.

A layer 416 including a light-emitting material and a second electrode 417 are formed respectively over the first electrode 413. Here, as a material for forming the first electrode 413 which serves as an anode, it is preferable to use a material with large work function. For example, a single layer of an ITO (indium tin oxide) film, an indium zinc oxide film, a titanium nitride film, a chrome film, a tungsten film, a Zn film, or a Pt film; a lamination of a film containing titanium nitride and aluminum as its main components and the above single layer; a three-layer lamination of the film containing titanium nitride and aluminum as its main components, a titanium nitride film, and the above single layer, or the like is used. By forming the first electrode to have a lamination structure, resistance as a wiring can be lower, and a preferable ohmic contact can be obtained. Thus the first electrode can serve as an anode.

The layer 416 including the light-emitting material is formed by vapor deposition using an evaporation mask or ink-jetting. The material which can be used for the electroluminescent layer 416, can be a low molecular type material or a high molecular type material. Further, as a material for the electroluminescent layer 416, normally, a single type layer or a laminated layer of the organic compound is used, however, in this example, a structure in which an inorganic compound is used for a part of the films formed of the organic compound is included. When the layer 416 including the light-emitting material is formed, the processing to expose to the atmosphere including oxygen is carried out before or after forming the organic compound layer which constitute the layer 416 including the light-emitting material.

When a display image made of a plurality of colors is to be obtained, each of the layers including a light emitting material is formed so as to separate by each of the emission colors. In this case, each of the layers including the light emitting material which emits each of the color may have different lamination structure, respectively.

As a material for the second electrode (cathode) 417 formed on the layer 416 including the light-emitting material, a material with small work function (Al, Ag, Li, Ca, or alloy of these materials such as MgAg, MgIn, AlLi, CaF$_2$, or CaN) is used. A lamination of a thin metal film and a transparent conductive film (Indium-tin-oxide (ITO), indium oxide-zinc alloy (In$_2$O$_3$-ZnO), zinc oxide (ZnO), or the like) is preferably used as the second electrode (cathode) in the case where the second electrode 417 is transmitted by light generated from the layer 416 including the light-emitting material.

By pasting a sealing substrate 404 and an element substrate 410 with an adhesive agent 405 together, a structure that a space 407 surrounded by the element substrate 410, the sealing substrate 404, and the adhesive agent 405 is equipped with the light-emitting element 418 is obtained. The structure that the space 407 is filled with the adhesive agent 405 is also included in addition to the one where the space 407 is filled with an inert gas (nitrogen, argon, or the like).

An epoxy resin is preferably used for the adhesive agent 405. Further, a material which hardly transmits moisture and oxygen is preferably used. As the sealing substrate 404, in addition to a glass substrate or a quartz substrate, a plastic substrate formed of FRP (Fiberglass-Reinforced plastic), PVF (polyvinylfluoride), myler, polyester, acrylic, or the like is used.

Accordingly, a light-emitting device having a light-emitting element manufactured according to this invention can be obtained.

EXAMPLE 5

Figure 7:
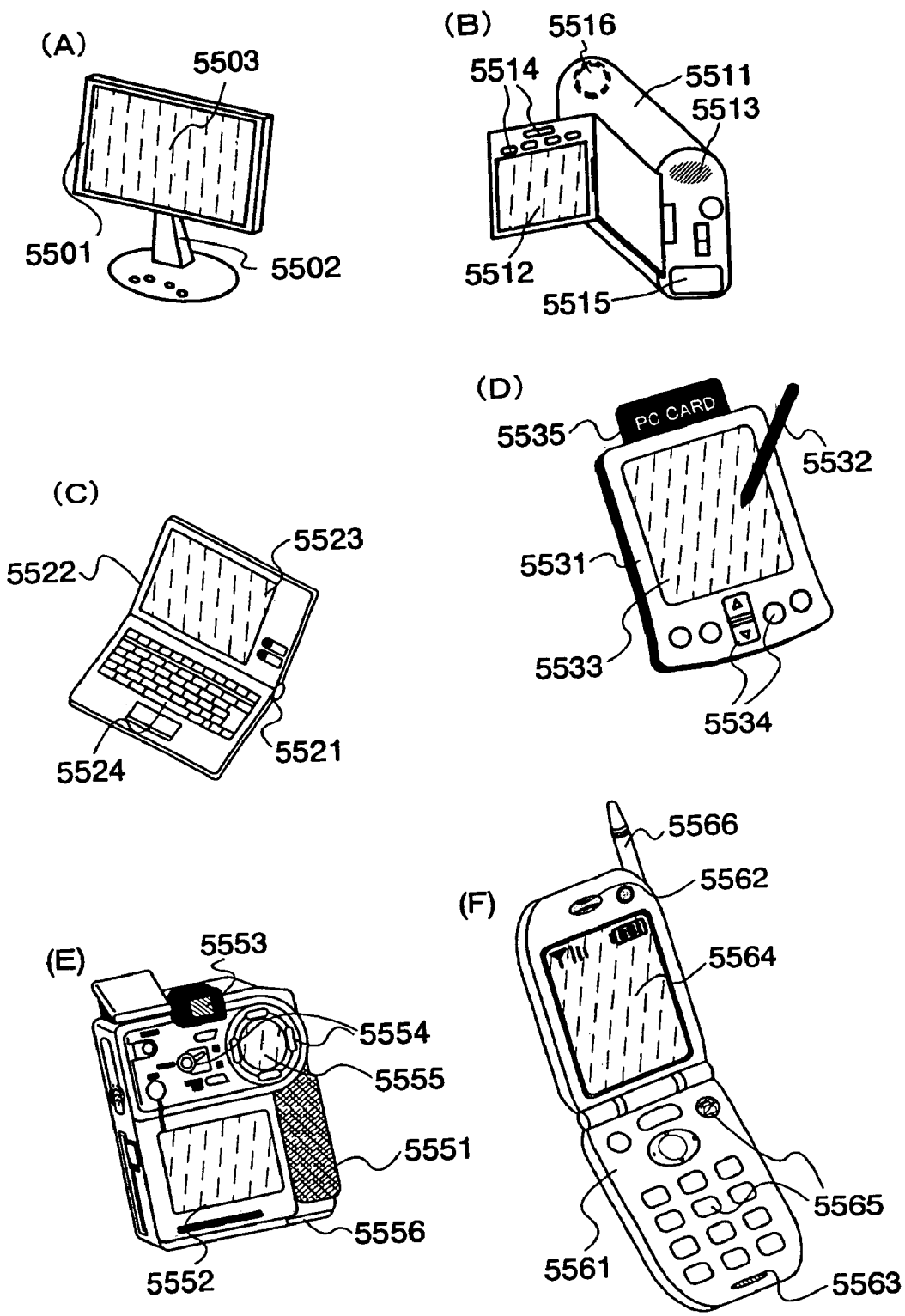
FIG. 7 is a diagram which describes electric apparatuses equipped with a light-emitting device manufactured according to the present invention.

In this example, electronic apparatuses manufactured according to the present invention are described with reference to FIG. 7. By using the invention, the light-emitting element has a ling life; therefore, long lifetime of a display function in the electronic apparatuses shown below for example can be enhanced. Furthermore, because secular rise of driver voltage can be controlled, lower power consumption can be enhanced.

FIG. 7A is a display device which includes a case 5501, a supporting medium 5502, and a display portion 5503. The display device can be completed by incorporating the light-emitting device shown in Example 4 into the display device.

FIG. 7B is a video camera which includes a main body 5511, a display portion 5512, a voice input 5513, an operation switch 5514, a battery 5515, and an image receiving portion 5516, and the like. A display device can be completed by incorporating the light-emitting device into the video camera.

FIG. 7C is a notebook type personal computer manufactured according to the present invention, which includes a main body 5521, a case 5522, a display portion 5523, a keyboard 5524, and the like. A display device can be completed by incorporating the light-emitting device shown in Example 4 into the personal computer.

FIG. 7D is a personal digital assistant (PDA) in which a main body 5531 is equipped with a display portion 5533, an external interface 5535, operation switches 5534, and the like. Also, a stylus 5532 is provided for operational attachment. A display device can be completed by incorporating the light-emitting device shown in Example 4 into the PDA.

FIG. 7E is a digital camera which includes a main body 5511, a display portion (A) 5552, an eye piece portion 5553, an operation switch 5554, a display portion (B) 5555, a battery 5556, and the like. A display device can be completed by incorporating the light-emitting device shown in Example 4 into the digital video camera.

FIG. 7F is a portable phone manufactured according to the present invention. A main body 5561 is equipped with a display portion 5564, a voice output portion 5562, operation switches 5565, antenna 5566, and the like. A display device can be completed by incorporating the light-emitting device shown in Example 4 into the portable phone.

The invention claimed is:

1. A method for manufacturing a light-emitting element, comprising the steps of:
    forming a light-emitting layer over a first electrode;
    forming an electron transporting layer over the light-emitting layer;
    exposing the electron transporting layer to an atmosphere including oxygen, wherein the processing to expose to the atmosphere including the oxygen is carried out at a room temperature;
    forming a layer for promoting electron injection over the electron transporting layer; and
    forming a second electrode over the layer for promoting electron injection after forming the layer for promoting electron injection.

2. A method for manufacturing a light-emitting element according to claim 1, wherein the electron transporting layer includes tris(8-quinolinolato)aluminum.

3. A method for manufacturing a light-emitting element according to claim 1, wherein the light-emitting layer includes N,N'-dimethylquinacridon and tris(8-quinolinolato)aluminum.

4. A light-emitting device which uses a light-emitting element described in claim 1 in a pixel portion.

5. An electric apparatus which uses a light-emitting device described in claim 4 in a pixel portion.

6. A method for manufacturing a light-emitting element according to claim 1, wherein the first electrode is an anode.

7. A method for manufacturing a light-emitting element according to claim 1, wherein the second electrode is a cathode.

8. A method for manufacturing a light-emitting element according to claim 1, wherein the layer for promoting electron injection includes at least one of lithium fluoride, cesium fluoride, and calcium fluoride.

9. A method for manufacturing a light-emitting element, comprising the steps of:
    forming a hole injecting layer over a first electrode;
    exposing the hole injecting layer to an atmosphere including oxygen;
    forming a light-emitting layer over the hole injecting layer;
    forming an electron transporting layer over the light-emitting layer;
    exposing the electron transporting layer to an atmosphere including oxygen;
    forming a layer for promoting electron injection over the electron transporting layer; and
    forming a second electrode over the layer for promoting electron injection after forming the layer for promoting electron injection.

10. A method for manufacturing a light-emitting element according to claim 9, wherein the electron transporting layer includes tris(8-quinolinolato)aluminum.

11. A method for manufacturing a light-emitting element according to claim 9, the processing of exposing to the atmosphere including the oxygen is carried out at a room temperature.

12. A method for manufacturing a light-emitting element according to claim 9, wherein the first electrode is an anode.

13. A method for manufacturing a light-emitting element according to claim 9, wherein the second electrode is a cathode.

14. A method for manufacturing a light-emitting element according to claim 9, wherein the layer for promoting electron injection includes at least one of lithium fluoride, cesium fluoride, and calcium fluoride.

15. A method for manufacturing a display device, comprising the steps of:
    forming a first electrode over a thin film transistor array substrate;
    forming a light-emitting layer over the first electrode;
    forming an electron transporting layer over the light-emitting layer;
    exposing the electron transporting layer to an atmosphere including oxygen, wherein the processing of exposing to the atmosphere including the oxygen is carried out at a room temperature;
    forming a layer for promoting electron injection over the electron transporting layer; and
    forming a second electrode over the layer for promoting electron injection after forming the layer for promoting electron injection.

16. A method for manufacturing a display device according to claim 15, wherein the electron transporting layer includes tris(8-quinolinolato)aluminum.

17. A method for manufacturing a display device according to claim 15, wherein the first electrode is an anode.

18. A method for manufacturing a display device according to claim 15, wherein the second electrode is a cathode.

19. A method for manufacturing a display device according to claim 15, wherein the layer for promoting electron injection includes at least one of lithium fluoride, cesium fluoride, and calcium fluoride.

20. A method for manufacturing a display device, comprising steps of:
    forming a first electrode over a thin film transistor array substrate;
    forming a hole injecting layer over the first electrode;
    exposing the hole injecting layer to an atmosphere including oxygen;
    forming a light-emitting layer over the hole injecting layer;
    forming an electron transporting layer over the light-emitting layer;
    exposing the electron transporting layer to an atmosphere including oxygen;
    forming a layer for promoting electron injection over the electron transporting layer; and
    forming a second electrode over the layer for promoting electron injection after forming the layer for promoting electron injection.

21. A method for manufacturing a display device according to claim 20, wherein the electron transporting layer includes tris(8-quinolinolato)aluminum.

22. A method for manufacturing a display device according to claim 20, wherein the processing of exposing to the atmosphere including the oxygen is called out at a room temperature.

23. A method for manufacturing a display device according to claim 20, wherein the first electrode is an anode.

24. A method for manufacturing a display device according to claim 20, wherein the second electrode is a cathode.

25. A method for manufacturing a display device according to claim 20, wherein the layer for promoting electron injection includes at least one of lithium fluoride, cesium fluoride, and calcium fluoride.

* * * * *